(12) United States Patent
Bertness et al.

(10) Patent No.: US 6,891,378 B2
(45) Date of Patent: May 10, 2005

(54) ELECTRONIC BATTERY TESTER

(75) Inventors: Kevin I. Bertness, Batavia, IL (US);
Clark E. Smith, Oswego, IL (US);
Roger S. Knopf, Elmhurst, IL (US)

(73) Assignee: Midtronics, Inc., Willowbrook, IL (US)

( * ) Notice: Subject to any disclaimer, the term of this patent is extended or adjusted under 35 U.S.C. 154(b) by 22 days.

(21) Appl. No.: 10/396,550

(22) Filed: Mar. 25, 2003

(65) Prior Publication Data

US 2004/0189308 A1 Sep. 30, 2004

(51) Int. Cl.[7] ............................................. G01N 27/416
(52) U.S. Cl. ........................ 324/426; 324/425; 320/132
(58) Field of Search ................................. 324/426, 427, 324/429, 430, 431, 433, 425; 320/132, 133, 134, 136, 139

(56) References Cited

U.S. PATENT DOCUMENTS

| | | | |
|---|---|---|---|
| 2,514,745 A | 7/1950 | Dalzell | 171/95 |
| 3,356,936 A | 12/1967 | Smith | 324/29.5 |
| 3,562,634 A | 2/1971 | Latner | 31/4 |
| 3,593,099 A | 7/1971 | Scholl | 320/13 |
| 3,607,673 A | 9/1971 | Seyl | 204/1 |
| 3,676,770 A | 7/1972 | Sharaf et al. | 324/29.5 |
| 3,729,989 A | 5/1973 | Little | 73/133 |
| 3,753,094 A | 8/1973 | Furuishi et al. | 324/29.5 |
| 3,808,522 A | 4/1974 | Sharaf | 324/29.5 |
| 3,811,089 A | 5/1974 | Strezelewicz | 324/170 |
| 3,873,911 A | 3/1975 | Champlin | 324/29.5 |
| 3,876,931 A | 4/1975 | Godshalk | 324/29.5 |
| 3,886,443 A | 5/1975 | Miyakawa et al. | 324/29.5 |
| 3,889,248 A | 6/1975 | Ritter | 340/249 |
| 3,906,329 A | 9/1975 | Bader | 320/44 |
| 3,909,708 A | 9/1975 | Champlin | 324/29.5 |
| 3,936,744 A | 2/1976 | Perlmutter | 324/158 |
| 3,946,299 A | 3/1976 | Christianson et al. | 320/43 |
| 3,947,757 A | 3/1976 | Grube et al. | 324/28 |
| 3,969,667 A | 7/1976 | McWilliams | 324/29.5 |
| 3,979,664 A | 9/1976 | Harris | 324/17 |
| 3,984,762 A | 10/1976 | Dowgiallo, Jr. | 324/29.5 |
| 3,984,768 A | 10/1976 | Staples | 324/62 |
| 3,989,544 A | 11/1976 | Santo | 429/65 |
| 4,008,619 A | 2/1977 | Alcaide et al. | 73/398 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/29.5 |
| 4,070,624 A | 1/1978 | Taylor | 327/158 |
| 4,086,531 A | 4/1978 | Bernier | 324/158 |
| 4,112,351 A | 9/1978 | Back et al. | 324/16 |

(Continued)

FOREIGN PATENT DOCUMENTS

| | | |
|---|---|---|
| DE | 29 26 716 B1 | 1/1981 |
| EP | 0 022 450 A1 | 1/1981 |
| EP | 0 637 754 A1 | 2/1995 |

(Continued)

OTHER PUBLICATIONS

"Notification of Transmittal of The International Search Report or the Declaration", PCT/US03/06577.

(Continued)

*Primary Examiner*—Michael Sherry
*Assistant Examiner*—Lawrence Luk
(74) *Attorney, Agent, or Firm*—Westman, Champlin & Kelly

(57) ABSTRACT

An electronic battery tester connectable to a battery through any one of multiple cables. The tester includes an input that can couple to any one of the multiple cables. Also included is a memory that contains multiple calibration values, each calibration value corresponds to a different one of the multiple cables. Test circuitry, which is coupled to the input and to the memory, detects which one of the multiple cables is coupled to the input, and tests the battery as a function of one of the multiple calibration values that corresponds to the detected one of the multiple cables.

19 Claims, 5 Drawing Sheets

U.S. PATENT DOCUMENTS

| | | | |
|---|---|---|---|
| 4,114,083 A | 9/1978 | Benham et al. | 320/39 |
| 4,126,874 A | 11/1978 | Suzuki et al. | 354/60 |
| 4,178,546 A | 12/1979 | Hulls et al. | 324/158 |
| 4,193,025 A | 3/1980 | Frailing et al. | 324/427 |
| 4,207,611 A | 6/1980 | Gordon | 364/580 |
| 4,217,645 A | 8/1980 | Barry et al. | 364/483 |
| 4,297,639 A | 10/1981 | Branham | 324/429 |
| 4,315,204 A | 2/1982 | Sievers et al. | 322/28 |
| 4,316,185 A | 2/1982 | Watrous et al. | 340/636 |
| 4,322,685 A | 3/1982 | Frailing et al. | 324/429 |
| 4,351,405 A | 9/1982 | Fields et al. | 180/65 |
| 4,361,809 A | 11/1982 | Bil et al. | 324/426 |
| 4,363,407 A | 12/1982 | Barkler et al. | 209/3.3 |
| 4,369,407 A | 1/1983 | Korbell | 324/416 |
| 4,379,989 A | 4/1983 | Kurz et al. | 320/26 |
| 4,379,990 A | 4/1983 | Sievers et al. | 322/99 |
| 4,385,269 A | 5/1983 | Aspinwall et al. | 320/14 |
| 4,390,828 A | 6/1983 | Converse et al. | 320/32 |
| 4,392,101 A | 7/1983 | Saar et al. | 320/20 |
| 4,396,880 A | 8/1983 | Windebank | 320/21 |
| 4,408,157 A | 10/1983 | Beaubien | 324/62 |
| 4,412,169 A | 10/1983 | Dell'Orto | 320/64 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/158 |
| 4,514,694 A | 4/1985 | Finger | 324/429 |
| 4,520,353 A | 5/1985 | McAuliffe | 340/636 |
| 4,564,798 A | 1/1986 | Young | 320/6 |
| 4,633,418 A | 12/1986 | Bishop | 364/554 |
| 4,659,977 A | 4/1987 | Kissel et al. | 320/64 |
| 4,663,580 A | 5/1987 | Wortman | 320/35 |
| 4,665,370 A | 5/1987 | Holland | 324/429 |
| 4,667,143 A | 5/1987 | Cooper et al. | 320/22 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/32 |
| 4,686,442 A | 8/1987 | Radomski | 320/17 |
| 4,697,134 A | 9/1987 | Burkum et al. | 320/48 |
| 4,707,795 A | 11/1987 | Alber et al. | 364/550 |
| 4,709,202 A | 11/1987 | Koenck et al. | 320/43 |
| 4,710,861 A | 12/1987 | Kanner | 363/46 |
| 4,719,428 A | 1/1988 | Liebermann | 324/436 |
| 4,743,855 A | 5/1988 | Randin et al. | 324/430 |
| 4,745,349 A | 5/1988 | Palanisamy et al. | 320/22 |
| 4,816,768 A | 3/1989 | Champlin | 324/428 |
| 4,820,966 A | 4/1989 | Fridman | 320/32 |
| 4,825,170 A | 4/1989 | Champlin | 324/436 |
| 4,847,547 A | 7/1989 | Eng, Jr. et al. | 320/35 |
| 4,849,700 A | 7/1989 | Morioka et al. | 324/427 |
| 4,876,495 A | 10/1989 | Palanisamy et al. | 320/18 |
| 4,881,038 A | 11/1989 | Champlin | 324/426 |
| 4,888,716 A | 12/1989 | Ueno | 364/550 |
| 4,912,416 A | 3/1990 | Champlin | 324/430 |
| 4,913,116 A | 4/1990 | Katogi et al. | 123/425 |
| 4,929,931 A | 5/1990 | McCuen | 340/636 |
| 4,931,738 A | 6/1990 | MacIntyre et al. | 324/435 |
| 4,937,528 A | 6/1990 | Palanisamy | 324/430 |
| 4,947,124 A | 8/1990 | Hauser | 324/430 |
| 4,956,597 A | 9/1990 | Heavey et al. | 320/14 |
| 4,968,941 A | 11/1990 | Rogers | 324/428 |
| 4,968,942 A | 11/1990 | Palanisamy | 324/430 |
| 5,004,979 A | 4/1991 | Marino et al. | 324/160 |
| 5,032,825 A | 7/1991 | Xuznicki | 340/636 |
| 5,037,778 A | 8/1991 | Stark et al. | 437/216 |
| 5,047,722 A | 9/1991 | Wurst et al. | 324/430 |
| 5,087,881 A | 2/1992 | Peacock | 324/378 |
| 5,095,223 A | 3/1992 | Thomas | 307/110 |
| 5,126,675 A | 6/1992 | Yang | 324/435 |
| 5,140,269 A | 8/1992 | Champlin | 324/433 |
| 5,144,218 A | 9/1992 | Bosscha | 320/44 |
| 5,144,248 A | 9/1992 | Alexandres et al. | 324/428 |
| 5,160,881 A | 11/1992 | Schramm et al. | 322/7 |
| 5,170,124 A | 12/1992 | Blair et al. | 324/434 |
| 5,179,335 A | 1/1993 | Nor | 320/21 |
| 5,194,799 A | 3/1993 | Tomantschger | 320/2 |
| 5,204,611 A | 4/1993 | Nor et al. | 320/21 |
| 5,214,370 A | 5/1993 | Harm et al. | 320/35 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/14 |
| 5,281,919 A | 1/1994 | Palanisamy | 324/427 |
| 5,281,920 A | 1/1994 | Wurst | 324/430 |
| 5,295,078 A | 3/1994 | Stich et al. | 364/483 |
| 5,298,797 A | 3/1994 | Redl | 307/246 |
| 5,300,874 A | 4/1994 | Shimamoto et al. | 320/15 |
| 5,302,902 A | 4/1994 | Groehl | 324/434 |
| 5,315,287 A | 5/1994 | Sol | 340/455 |
| 5,321,626 A | 6/1994 | Palladino | 364/483 |
| 5,331,268 A | 7/1994 | Patino et al. | 320/20 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/35 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/35 |
| 5,365,160 A | 11/1994 | Leppo et al. | 320/22 |
| 5,365,453 A | 11/1994 | Startup et al. | 364/481 |
| 5,381,096 A | 1/1995 | Hirzel | 324/427 |
| 5,412,323 A | 5/1995 | Kato et al. | 324/429 |
| 5,426,371 A | 6/1995 | Salley et al. | 324/429 |
| 5,426,416 A | 6/1995 | Jefferies et al. | 340/664 |
| 5,432,426 A | 7/1995 | Yoshida | 320/20 |
| 5,434,495 A | 7/1995 | Toko | 320/44 |
| 5,435,185 A | 7/1995 | Eagan | 73/587 |
| 5,442,274 A | 8/1995 | Tamai | 320/23 |
| 5,445,026 A | 8/1995 | Eagan | 73/591 |
| 5,449,996 A | 9/1995 | Matsumoto et al. | 320/20 |
| 5,449,997 A | 9/1995 | Gilmore et al. | 320/39 |
| 5,451,881 A | 9/1995 | Finger | 324/433 |
| 5,457,377 A | 10/1995 | Jonsson | 320/5 |
| 5,469,043 A | 11/1995 | Cherng et al. | 320/31 |
| 5,485,090 A | 1/1996 | Stephens | 324/433 |
| 5,488,300 A | 1/1996 | Jamieson | 324/432 |
| 5,519,383 A | 5/1996 | De La Rosa | 340/636 |
| 5,528,148 A | 6/1996 | Rogers | 324/426 |
| 5,537,967 A | 7/1996 | Tashiro et al. | 123/792.1 |
| 5,541,489 A | 7/1996 | Dunstan | 320/2 |
| 5,546,317 A | 8/1996 | Andrieu | 364/481 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/48 |
| 5,572,136 A | 11/1996 | Champlin | 324/426 |
| 5,574,355 A | 11/1996 | McShane et al. | 320/39 |
| 5,583,416 A | 12/1996 | Klang | 320/22 |
| 5,585,728 A | 12/1996 | Champlin | 324/427 |
| 5,589,757 A | 12/1996 | Klang | 320/22 |
| 5,592,093 A | 1/1997 | Klingbiel | 324/426 |
| 5,596,260 A | 1/1997 | Moravec et al. | 320/30 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/48 |
| 5,621,298 A | 4/1997 | Harvey | 320/5 |
| 5,633,985 A | 5/1997 | Severson et al. | 395/2.76 |
| 5,637,978 A | 6/1997 | Kellett et al. | 320/2 |
| 5,642,031 A | 6/1997 | Brotto | 320/21 |
| 5,650,937 A | 7/1997 | Bounaga | 364/483 |

| Patent No. | Date | Inventor | Class |
|---|---|---|---|
| 5,652,501 A | 7/1997 | McClure et al. | 320/17 |
| 5,653,659 A | 8/1997 | Kunibe et al. | 477/111 |
| 5,656,920 A | 8/1997 | Cherng et al. | 320/31 |
| 5,675,234 A | 10/1997 | Greene | 320/15 |
| 5,677,077 A | 10/1997 | Faulk | 429/90 |
| 5,699,050 A | 12/1997 | Kanazawa | 340/636 |
| 5,701,089 A | 12/1997 | Perkins | 327/772 |
| 5,705,929 A | 1/1998 | Caravello et al. | 324/430 |
| 5,710,503 A | 1/1998 | Sideris et al. | 320/6 |
| 5,711,648 A | 1/1998 | Hammerslag | 414/786 |
| 5,717,336 A | 2/1998 | Basell et al. | 324/430 |
| 5,717,937 A | 2/1998 | Fritz | 395/750.01 |
| 5,739,667 A | 4/1998 | Matsuda et al. | 320/5 |
| 5,747,909 A | 5/1998 | Syverson et al. | 310/156 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,773,978 A | 6/1998 | Becker | 324/430 |
| 5,789,899 A | 8/1998 | van Phuoc et al. | 320/30 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/43.4 |
| 5,818,234 A | 10/1998 | McKinnon | 324/433 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,862,515 A | 1/1999 | Kobayashi et al. | 702/63 |
| 5,872,443 A | 2/1999 | Williamson | 320/21 |
| 5,895,440 A | 4/1999 | Proctor et al. | 702/63 |
| 5,914,605 A | 6/1999 | Bertness | 324/430 |
| 5,927,938 A | 7/1999 | Hammerslag | 414/809 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | |
| 5,945,829 A | 8/1999 | Bertness | 324/430 |
| 5,951,229 A | 9/1999 | Hammerslag | 414/398 |
| 5,961,561 A | 10/1999 | Wakefield, II | 701/29 |
| 5,961,604 A | 10/1999 | Anderson et al. | 709/229 |
| 5,969,625 A | 10/1999 | Russo | 340/636 |
| 6,002,238 A | 12/1999 | Champlin | 320/134 |
| 6,008,652 A | 12/1999 | Theofanopoulos et al. | 324/434 |
| 6,009,369 A | 12/1999 | Boisvert et al. | 701/99 |
| 6,031,354 A | 2/2000 | Wiley et al. | 320/116 |
| 6,037,751 A | 3/2000 | Klang | 320/160 |
| 6,037,777 A | 3/2000 | Champlin | 324/430 |
| 6,051,976 A | 4/2000 | Bertness | 324/426 |
| 6,061,638 A | 5/2000 | Joyce | 702/63 |
| 6,072,299 A | 6/2000 | Kurie et al. | 320/112 |
| 6,072,300 A | 6/2000 | Tsuji | 320/116 |
| 6,081,098 A | 6/2000 | Bertness et al. | 320/134 |
| 6,091,245 A | 7/2000 | Bertness | 324/426 |
| 6,094,033 A | 7/2000 | Ding et al. | 320/132 |
| 6,104,167 A | 8/2000 | Bertness et al. | 320/132 |
| 6,114,834 A | 9/2000 | Parise | 320/109 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,150,793 A | 11/2000 | Lesesky et al. | 320/104 |
| 6,161,640 A | 12/2000 | Yamaguchi | 180/65.8 |
| 6,163,156 A | 12/2000 | Bertness | 324/426 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,181,545 B1 | 1/2001 | Amatucci et al. | 361/502 |
| 6,222,369 B1 | 4/2001 | Champlin | 324/430 |
| 6,225,808 B1 | 5/2001 | Varghese et al. | 324/426 |
| 6,236,332 B1 | 5/2001 | Conkright et al. | 340/825.06 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,254 B1 | 7/2001 | Klang | 324/427 |
| 6,262,563 B1 | 7/2001 | Champlin | 320/134 |
| 6,263,268 B1 | 7/2001 | Nathanson | 701/29 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 32/132 |
| 6,316,914 B1 | 11/2001 | Bertness | 320/134 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| 6,384,608 B1 | 5/2002 | Namaky | 324/425 |
| 6,388,448 B1 | 5/2002 | Cervas | 324/426 |
| 6,392,414 B2 | 5/2002 | Bertness | 324/429 |
| 6,411,098 B1 | 6/2002 | Laletin | 324/436 |
| 6,417,669 B1 | 7/2002 | Champlin | 324/426 |
| 6,424,157 B1 | 7/2002 | Gollomp et al. | 324/430 |
| 6,424,158 B2 | 7/2002 | Klang | 324/433 |
| 6,441,585 B1 | 8/2002 | Bertness | 320/132 |
| 6,445,158 B1 | 9/2002 | Bertness et al. | 320/104 |
| 6,456,045 B1 | 9/2002 | Troy et al. | 320/139 |
| 6,466,025 B1 | 10/2002 | Klang | 324/429 |
| 6,466,026 B1 | 10/2002 | Champlin | 324/430 |
| 6,495,990 B2 | 12/2002 | Champlin | 320/132 |
| 6,534,993 B2 | 3/2003 | Bertness | 324/433 |
| 6,544,078 B2 | 4/2003 | Palmisano et al. | 439/762 |
| 6,556,019 B2 | 4/2003 | Bertness | 324/426 |
| 6,566,883 B1 | 5/2003 | Vonderhaar et al. | 324/426 |
| 6,570,385 B1 * | 5/2003 | Roberts et al. | 324/378 |
| 6,586,941 B2 | 7/2003 | Bertness et al. | 324/426 |
| 6,597,150 B1 | 7/2003 | Bertness et al. | 320/104 |
| 2002/0171428 A1 | 11/2002 | Bertness | 324/426 |
| 2003/0194672 A1 | 10/2003 | Roberts et al. | 431/196 |
| 2004/0051532 A1 * | 3/2004 | Smith et al. | 324/426 |
| 2004/0054503 A1 * | 3/2004 | Namaky | 702/183 |
| 2004/0108856 A1 * | 6/2004 | Johnson | 324/426 |

FOREIGN PATENT DOCUMENTS

| | | |
|---|---|---|
| EP | 0 772 056 A1 | 5/1997 |
| FR | 2 749 397 | 12/1997 |
| GB | 2 088 159 A | 6/1982 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04131779 | 5/1992 |
| JP | 04372536 | 12/1992 |
| JP | 5216550 | 8/1993 |
| JP | 7-128414 | 5/1995 |
| JP | 09061505 | 3/1997 |
| JP | 10056744 | 2/1998 |
| RU | 2089015 C1 | 8/1997 |
| WO | WO 94/05069 | 3/1994 |
| WO | WO 98/04910 | 2/1998 |

| | | |
|---|---|---|
| WO | WO 99/23738 | 5/1999 |
| WO | WO 00/62049 | 10/2000 |
| WO | WO 00/67359 | 11/2000 |
| WO | WO 01/51947 | 7/2001 |

OTHER PUBLICATIONS

"Electrochemical Impedance Spectroscopy in Battery Development and Testing", *Batteries International*, Apr. 1997, pp. 59 and 62–63.

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368.

"A Look at the Impedance of a Cell", by S. Debardelaben, *IEEE*, 1988, pp. 394–397.

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp. 1–11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"Battery Impedance", by E. Willihnganz et al., *Electrical Engineering*, Sep. 1959, pp. 922–925.

"JIS Japanese Industrial Standard–Lead Acid Batteries for Automobiles", *Japanes Standards Association UDC*, 621.355.2:629.113.006, Nov. 1995.

"Performance of Dry Cells", by C. Hamuechen, Preprint of *Am. Electrochem. Soc.*, Apr. 18–20, 1912 paper No. 19, pp. 1–5.

"A Bridge for Measuring Storage Battery Resistance", by E. Willihncanz, *The Electrochemical Society*, preprint 79–20, Apr. 1941, pp. 253–258.

National Semiconductor Corporation, "High Q Notch Filter", 3/69, Linear Brief 5, Mar. 1969.

Burr–Brown Corporation, "Design A 60 Hz Notch Filter with the UAF42", 1/94, AB– 071, 1994.

National Semiconductor Corporation, "LMF90–$4^{th}$–Order Elliptic Notch Filter", 12/94, RRD–B30M115, Dec. 1994.

"Alligator Clips with Wire Penetrators" *J.S. Popper, Inc.* product information, downloaded from http://www.jspopper.com/, undated.

"#: LM78S40 Simple Switcher DC to DC Converter", *ITM e–Catalog*, downloaded from http://www.pcbcafe.com, undated.

"Simple DC–DC Converts Allows Use of Single Battery", *Electronix Express*, downloaded from http://www.elexp.com/t_dc–dc.htm, undated.

"DC–DC Converter Basics", *Power Designers*, downloaded from http://www.powederdesigners.com/InforWeb.design_center/articles/DC–DC/converter.shtm, undated.

"Notification of Transmittal of The International Search Report or the Declaration", PCT/US02/29461.

* cited by examiner

ELECTRONIC BATTERY TESTER

BACKGROUND OF THE INVENTION

The present invention relates to testing of storage batteries. More specifically, the present invention relates to an electronic battery tester capable of detecting the type of cable to which it is connected.

Storage batteries, such as lead acid storage batteries of the type used in the automotive industry, have existed for many years. However, understanding the nature of such storage batteries, how such storage batteries operate and how to accurately test such batteries has been an ongoing endeavor and has proved quite difficult. Storage batteries consist of a plurality of individual storage cells electrically connected in series. Typically each cell has a voltage potential of about 2.1 volts. By connecting the cells in series, the voltages of the individual cells are added in a cumulative manner. For example, in a typical automotive storage battery, six storage cells are used to provide a total voltage when the battery is fully charged of 12.6 volts.

There has been a long history of attempts to accurately test the condition of storage batteries. A simple test is to measure the voltage of the battery. If the voltage is below a certain threshold, the battery is determined to be bad. However, this test is inconvenient because it requires the battery to be charged prior to performing the test. If the battery is discharged, the voltage will be low and a good battery may be incorrectly tested as bad. Furthermore, such a test does not give any indication of how much energy is stored in the battery. Another technique for testing a battery is referred as a load test. In a load test, the battery is discharged using a known load. As the battery is discharged, the voltage across the battery is monitored and used to determine the condition of the battery. This technique requires that the battery be sufficiently charged in order that it can supply current to the load.

More recently, a technique has been pioneered by Dr. Keith S. Champlin and Midtronics, Inc. for testing storage batteries by measuring the conductance of the batteries. This technique is described in a number of United States patents, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELL AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM, U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Ser. No. 09/703,270, filed Oct. 31, 2000, entitled ELECTRONIC BATTERY TESTER; U.S. Ser. No. 09/780,146, filed Feb. 9, 2001, entitled STORAGE BATTERY WITH INTEGRAL BATTERY TESTER; U.S. Ser. No. 09/816,768, filed Mar. 23, 2001, entitled MODULAR BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/960,117, filed Sep. 20, 2001, entitled IN-VEHICLE BATTERY MONITOR; U.S. Ser. No. 09/908,389, filed Jul. 18, 2001, entitled BATTERY CLAMP WITH INTEGRATED CIRCUIT SENSOR; U.S. Ser. No. 09/908,278, filed Jul. 18, 2001, entitled BATTERY CLAMP WITH EMBEDDED ENVIRONMENT SENSOR; U.S. Ser. No. 09/880,473, filed Jun. 13, 2001; entitled BATTERY TEST MODULE; U.S. Ser. No. 09/940,684, filed Aug. 27, 2001, entitled METHOD AND APPARATUS FOR EVALUATING STORED CHARGE IN AN ELECTROCHEMICAL CELL OR BATTERY; U.S. Ser. No. 60/330,441, filed Oct. 17, 2001, entitled ELECTRONIC BATTERY TESTER WITH RELATIVE TEST OUTPUT; U.S. Ser. No. 60/348,479, filed Oct. 29, 2001, entitled CONCEPT FOR TESTING HIGH POWER VRLA BATTERIES; U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 09/992,350, filed Nov. 26, 2001, entitled ELECTRONIC BATTERY TESTER, U.S. Ser. No. 60/341,902, filed Dec. 19, 2001, entitled BATTERY TESTER MODULE; U.S. Ser. No. 10/042,451, filed Jan. 8, 2002, entitled BATTERY CHARGE CONTROL DEVICE, U.S. Ser. No. 10/073,378, filed Feb. 8, 2002, entitled METHOD AND APPARATUS USING A CIRCUIT MODEL TO EVALUATE CELL/BATTERY PARAMETERS; U.S. Ser. No. 10/093,853, filed Mar. 7, 2002, entitled ELECTRONIC BATTERY TESTER WITH NETWORK COMMUNICATION; U.S. Ser. No. 60/364,656, filed Mar. 14, 2002, entitled ELECTRONIC BATTERY TESTER WITH LOW TEMPERATURE RATING DETERMINATION; U.S. Ser. No. 10/098,741, filed Mar. 14, 2002, entitled METHOD AND APPARATUS FOR AUDITING A BATTERY TEST; U.S. Ser. No. 10/101,543, filed Mar. 19, 2002, entitled ELECTRONIC BATTERY TESTER; U.S. Ser. No. 10/112,114, filed Mar. 28, 2002; U.S. Ser. No. 10/109,734, filed Mar. 28, 2002; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 10/128,790, filed Apr. 22, 2002, entitled METHOD OF DISTRIBUTING JUMP-START BOOSTER PACKS; U.S. Ser. No. 60/379,281, filed May 8, 2002, entitled METHOD FOR DETERMINING BATTERY STATE OF CHARGE; U.S. Ser. No. 10/143,307, filed May 10, 2002, entitled ELECTRONIC BATTERY TESTER; U.S. Ser. No. 60/387,046, filed Jun. 7, 2002, entitled METHOD AND APPARATUS FOR INCREASING THE LIFE OF A STORAGE BATTERY; U.S. Ser. No. 10/177,635, filed Jun. 21, 2002, entitled BATTERY CHARGER WITH BOOSTER PACK; U.S. Ser. No. 10/207,495, filed Jul. 29, 2002, entitled KELVIN CLAMP FOR ELECTRICALLY COUPLING TO A BATTERY CONTACT; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 60/408,542, filed Sep. 5, 2002, entitled BATTERY TEST OUTPUTS ADJUSTED BASED UPON TEMPERATURE; U.S. Ser. No. 10/246,439, filed Sep. 18, 2002, entitled BATTERY TESTER UPGRADE USING SOFTWARE KEY; U.S. Ser.

No. 60/415,399, filed Oct. 2, 2002, entitled QUERY BASED ELECTRONIC BATTERY TESTER; and U.S. Ser. No. 10/263,473, filed Oct. 2, 2002, entitled ELECTRONIC BATTERY TESTER WITH RELATIVE TEST OUTPUT; U.S. Ser. No. 60/415,796, filed Oct. 3, 2002, entitled QUERY BASED ELECTRONIC BATTERY TESTER; U.S. Ser. No. 10/271,342, filed Oct. 15, 2002, entitled IN-VEHICLE BATTERY MONITOR; U.S. Ser. No. 10/270,777, filed Oct. 15, 2002, entitled PROGRAMMABLE CURRENT EXCITER FOR MEASURING AC IMMITTANCE OF CELLS AND BATTERIES, which are incorporated herein in their entirety.

In general, a conventional battery tester is capable of testing a wide variety of batteries designed for, and used in, different applications. However, each time such a battery tester is used to test a different type of battery, the tester user may have to use a different cable to couple the tester to the battery and may also have to select a different testing option before the test is carried out. Reliance on the tester user to select an appropriate testing option can result in the introduction of errors in the testing process.

SUMMARY OF THE INVENTION

The present invention provides an electronic battery tester connectable to a battery through any one of multiple cables. The tester includes an input that can couple to any one of the multiple cables. Also included is a memory that contains multiple calibration values, each calibration value corresponds to a different one of the multiple cables. Test circuitry, which is coupled to the input and to the memory, detects which one of the multiple cables is coupled to the input, and tests the battery as a function of one of the multiple calibration values that corresponds to the detected one of the multiple cables.

The present invention also provides a cable for coupling a battery to a battery tester, wherein the cable includes a characteristic that is detectable by the tester.

DETAILED DESCRIPTION OF THE PREFERRED EMBODIMENTS

The present invention includes a system implemented in an electronic battery tester, by which the tester detects a type of cable through which it is coupled to a battery. The tester then selects a calibration value, suitable for the detected cable, from a plurality of calibration values and tests the battery through the cable as a function of the selected calibration value. The present invention also includes a cable for coupling a battery to a battery tester, wherein the cable includes a characteristic that is detectable by the tester.

Figure 1:
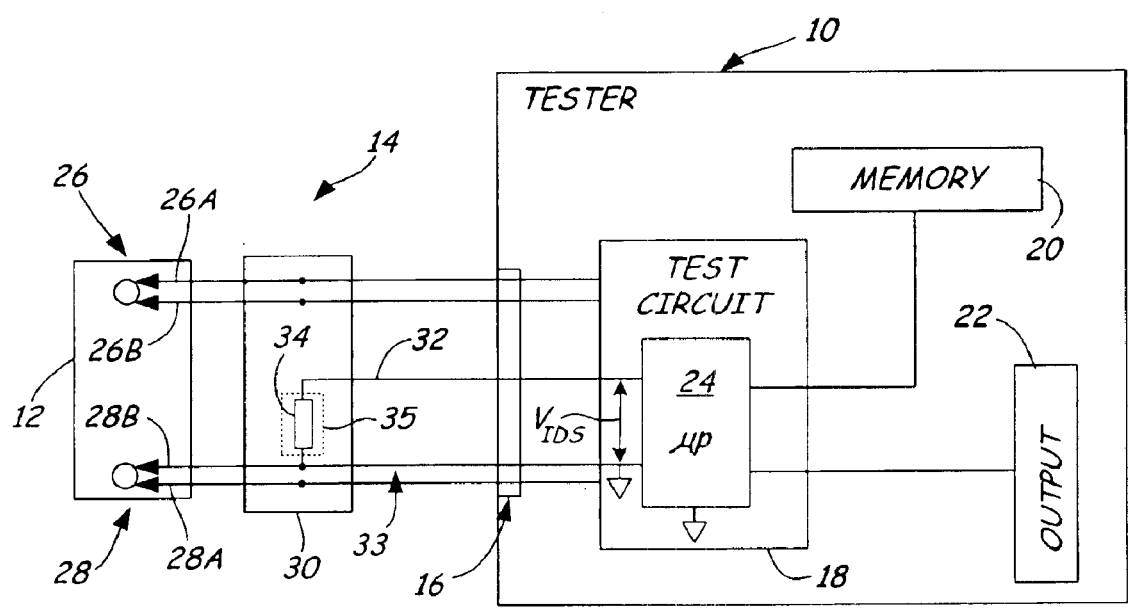
FIG. 1 is a block diagram of a battery tester coupled to a battery via a cable in accordance with an illustrative embodiment of the present invention.

FIG. 1 is a very simplified block diagram of a battery tester 10 coupled to a battery 12 via a cable 14 in accordance with an illustrative embodiment of the present invention. The same reference numerals are used in the various figures to represent the same or similar elements. Note that FIG. 1 is a simplified block diagram of a specific type of battery tester. However, the present invention is applicable to any type of battery tester including those which do not use dynamic parameters. Other types of example testers include testers that conduct load tests, current based tests, voltage based tests, tests which apply various conditions or observe various performance parameters of a battery, etc. Battery tester 10 includes an input 16, a test circuit 18, a memory 20 and an output 22. Test circuit 18 includes a microprocessor system 24 and other circuitry, shown in FIG. 4, configured to measure a dynamic parameter of battery 12. As used herein, a dynamic parameter is one which is related to a signal having an alternating current (AC) component. The signal can be either applied directly or drawn from battery 12. Example dynamic parameters include dynamic resistance, conductance, impedance, admittance, etc. This list is not exhaustive, for example, a dynamic parameter can include a component value of an equivalent circuit of battery 12. Microprocessor system 24 controls the operation of other components within test circuitry 18 and, in turn, carries out different battery testing functions based upon battery testing instructions stored in memory 20.

As can be seen in FIG. 1, battery tester 10 is coupled to battery 12 with the help of cable 14. In the embodiment shown in FIG. 1, cable 14 includes a four-point connection known as a Kelvin connection formed by connections 26 and 28. With such a Kelvin connection, two couplings are provided to the positive and negative terminals of battery 12. First Kelvin connection 26 includes a first conductor 26A and a second conductor 26B, which couple to tester input 16 via plug 30. Similarly, first conductor 28A and second conductor 28B of second Kelvin connection 28 also couple to tester input 16 via plug 30. As can be seen in FIG. 1, plug 30 of cable 14 further includes a cable identification conductor 32 that also connects to battery tester input 16. Employing Kelvin connections 26 and 28 allows one of the electrical connections on each side of battery 12 to carry large amounts of current while the other pair of connections can be used to obtain accurate voltage readings. Note that in other embodiments of the present invention, instead of employing Kelvin connections 26 and 28, cable 14 can include a single conductor to couple the first battery terminal to tester 10 and a single conductor to couple the second battery terminal to tester 10. Details regarding testing battery 12 with the help of Kelvin connections 26 and 28 are provided further below in connection with FIG. 4.

Figure 2:
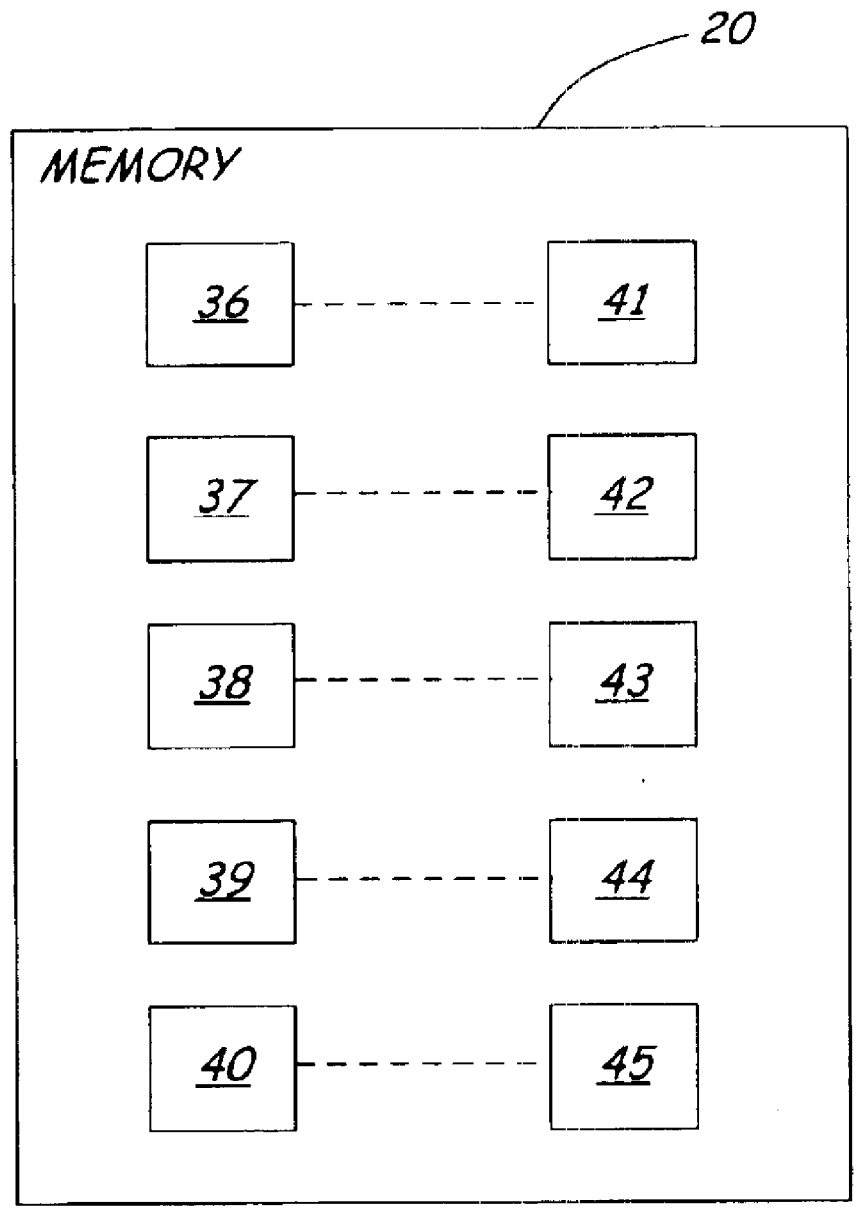
FIG. 2 is a block diagram illustrating data stored in battery tester memory in accordance with an embodiment of the present invention.

As mentioned above, different types of cables 14 may be required when different types of batteries 12 are tested using tester 10. In accordance with the present invention, tester 10 detects the type of cable 14 through which it is coupled to battery 12. Tester 10 then selects a calibration value, suitable for detected cable 14, from a plurality of calibration values stored in memory 20 and tests battery 12 through cable 14 as a function of the selected calibration value. Tester 10 identifies cable 14 with the help of a cable identification characteristic 34 included in cable identification conductor 32 and contained in memory 20. As shown in FIG. 2, memory 20 includes a plurality of stored cable identification characteristics 36–40, each of the stored cable identification characteristics corresponding to a different cable. As mentioned above, memory 20 also contains a plurality of calibration values 41–45, each different calibration value of the plurality of calibration values 41–45 corresponds to a different identification characteristic of the plurality of identification characteristics 36–40. For example, calibration value 41 corresponds to identification characteristic 36, calibration value 42 corresponds to identification characteristic 37, etc.

During operation, microprocessor system 24 of tester 10 provides a cable detection supply voltage, $V_{IDS}$, between ends of cable identification conductor 32 and conductor 28B, which couple to input 16 of tester 10. For simplification, components such as pull up and/or pull down resistors and other power supply circuitry that may be employed to provide $V_{IDS}$ are not shown. An electrical response of cable test circuit 33, formed by cable identification conductor 32, including identification characteristic 34, and conductor 28B, to $V_{IDS}$ is utilized by microprocessor system 18 to identify cable 14. Specifically, microprocessor system 18 can utilize one or more voltage and/or current measurements, for example, obtained from voltage and/or current sensor(s) (not shown) suitably coupled to cable test circuit 33 and to microprocessor system 18 to determine characteristic 34 of cable identification conductor 32. Upon determining characteristic 34, microprocessor system 18 compares determined characteristic 34 with different individual stored characteristics of the plurality of stored characteristics. If a match is detected between a particular stored characteristic and detected characteristic 34, microprocessor 18 utilizes the calibration value corresponding to the detected and matched characteristic in computations that it carries out to determine the condition of battery 12. For example, if microprocessor system 18 determines that detected characteristic 34 matches stored identification characteristic 37, it tests battery 12 as a function of calibration value 42, which corresponds to stored identification characteristic 37. If no match is obtained, a default calibration value may be used or a message may be displayed to the user via output 22 indicating that tester 10 cannot recognize the cable that it is coupled to.

Figure 3:
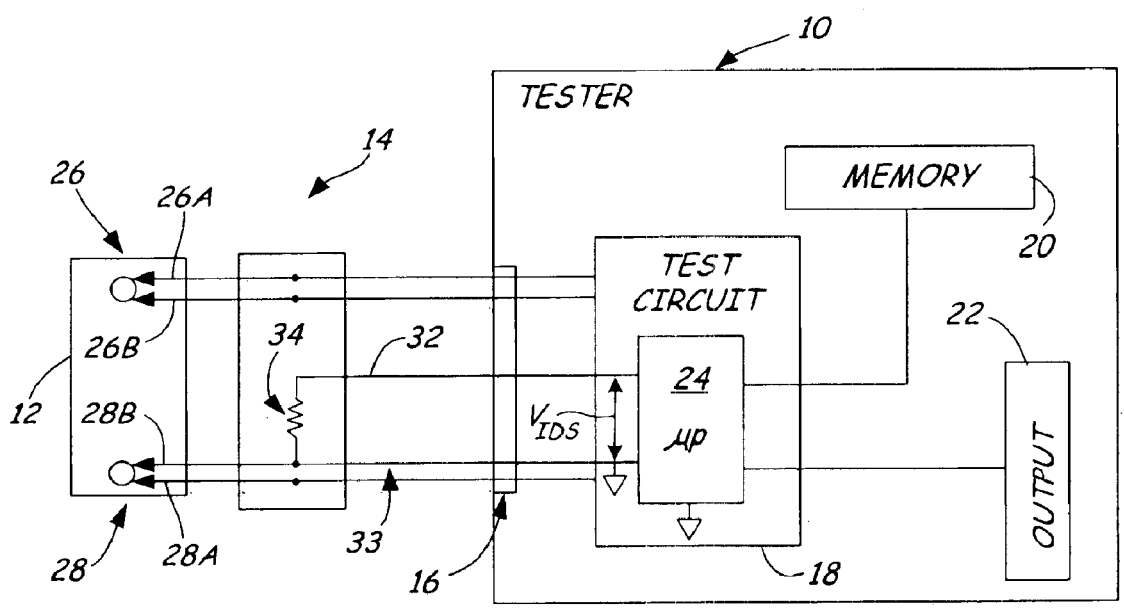
FIG. 3 is a block diagram of a battery tester coupled to a battery via a cable in accordance with an illustrative embodiment of the present invention.

FIG. 3 is a simplified block diagram of the present invention, wherein characteristic 34 is a resistor having a particular resistance value. As described above, in operation, voltage $V_{IDS}$ is applied to cable test circuit 33. Therefore, the voltage across resistor 34 and the current flowing through cable identification conductor 32 is measured by voltage and current sensors (not shown) coupled to microprocessor system 24. Microprocessor system 34 determines the resistance of resistor 34 and compares the determined resistance value with stored identification characteristics 36–40, which are different resistance values, each corresponding to a different cable 14 connected to tester 10. If a match is obtained between the determined resistance value and one of the stored resistance values 36–40, tester 10 tests battery 12 as a function of the calibration value corresponding to the detected and matched resistance value. If no match is obtained, a default calibration value is used or a suitable message is displayed via output 22 as described above in connection with FIG. 1.

Instead of a resistor, identification characteristic 34 can comprise an inductor, a capacitor, a transponder, a Zener diode, a current source, etc., or a suitable combination of these components that have different electrical values. $V_{IDS}$ may be an AC or DC voltage. Although cable test circuit 33 (FIGS. 1 and 3) is shown as being formed by cable identification conductor 32 coupled to Kelvin conductor 28B, cable identification conductor 32 may be coupled to any one of conductors 26A, 26B, 28A and 28B. Further, in embodiments of the present invention, instead of employing a Kelvin conductor to complete cable test circuit 33, an additional conductor may be employed to thereby provide a cable test circuit that is independent of the Kelvin conductors. In general, any means for identifying and recognizing cable 14, including sending and receiving digital messages with cable identification information, may be employed in the present invention. In embodiments of the present invention, plug 30 includes a memory 35 configured to store and to provide identification characteristic 33 to tester 10.

Figure 4:
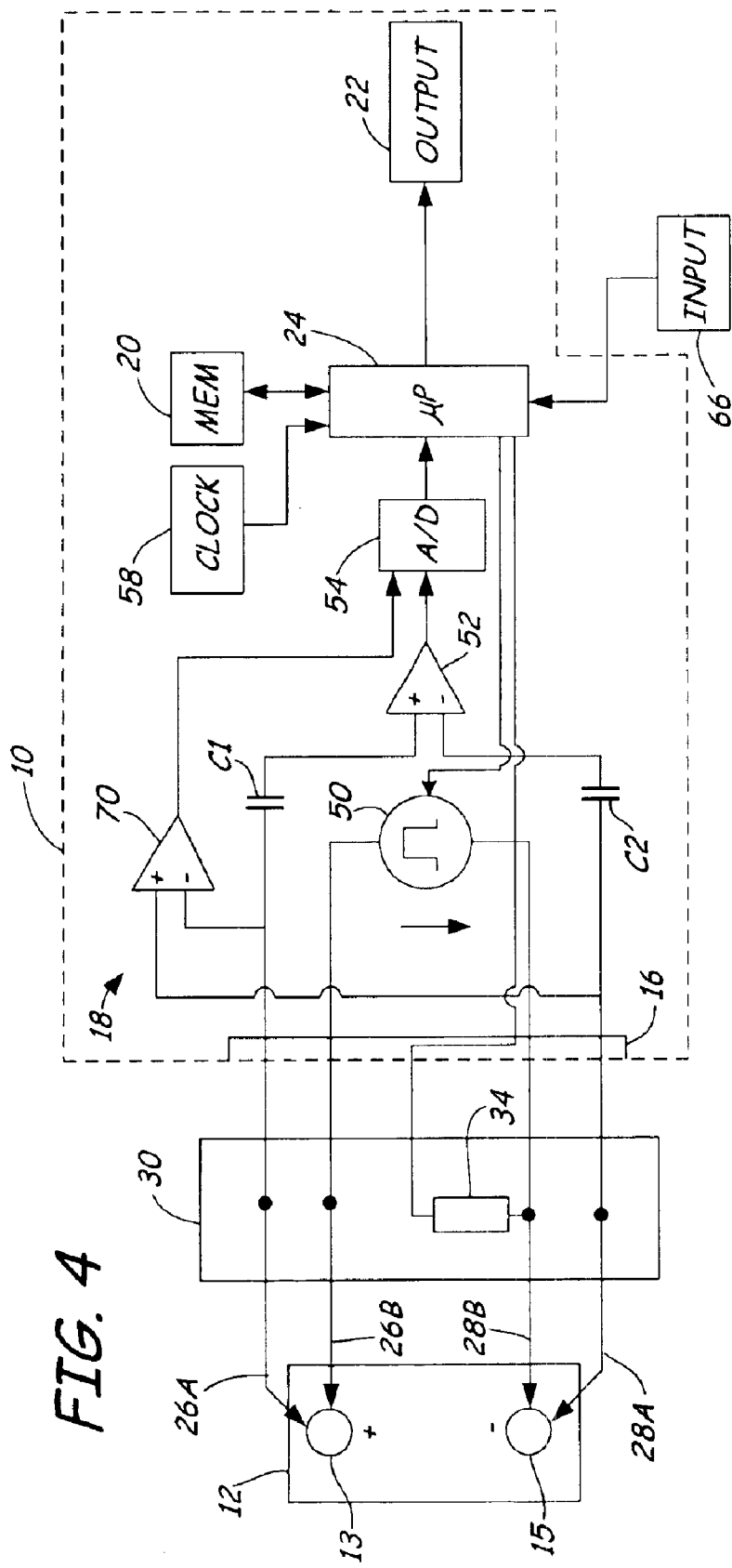
FIG. 4 is a block diagram illustrating different components of test circuitry within the battery tester of FIGS. 1 and 3.

FIG. 4 is a simplified block diagram of electronic battery tester circuitry 10 in accordance with a specific embodiment of the present invention. In addition to input 16, memory 20, output 22 and microprocessor system 24, tester 10 also includes current source 50, differential amplifier 52 and analog-to-digital converter 54. Current source 50 provides one example of a forcing function for use with the invention. Amplifier 52 is capacitively coupled to battery 12 through capacitors $C_1$ and $C_2$. Amplifier 52 has an output connected to an input of analog-to-digital converter 54 which in turn has an output connected to microprocessor system 24. Microprocessor system 24 is also capable of receiving an input from input device 68.

As described above, tester 10 detects the type of cable that it is connected to and accordingly selects a suitable calibration value to be utilized for testing battery 12. During testing of battery 12, current source 50 is controlled by microprocessor system 24 and provides a current I in the direction shown by the arrow in FIG. 4. In one embodiment, this is a sine wave, square wave or a pulse. Differential amplifier 52 is connected to terminals 13 and 15 of battery 12 through capacitors $C_1$ and $C_2$, respectively, and provides an output related to the voltage potential difference between terminals 13 and 15. In a preferred embodiment, amplifier 52 has a high input impedance. Tester 10 includes differential amplifier 70 having inverting and noninverting inputs connected to terminals 13 and 15, respectively. Amplifier 70 is connected to measure the open circuit potential voltage ($V_{BAT}$) of battery 12 between terminals 13 and 15 and is one example of a dynamic response sensor used to sense the time varying response of the battery 12 to the applied time varying forcing function. The output of amplifier 70 is provided to analog-to-digital converter 54 such that the voltage across terminals 13 and 15 can be measured by microprocessor system 24. The output of differential amplifier 52 is converted to a digital format and is provided to microprocessor system 24. Microprocessor system 24 operates at a frequency determined by system clock 58 and in accordance with programmable instructions stored in memory 20.

Microprocessor system 24 determines the conductance of battery 12 by applying a current pulse I using current source 50. This measurement provides a dynamic parameter related to the battery. Of course, any such dynamic parameter can be measured including resistance, admittance, impedance or their combination along with conductance. Further, any type of time varying signal can be used to obtain the dynamic parameter. The signal can be generated using an active forcing function or using a forcing function which provides a switchable load, for example, coupled to the battery 12. The processing circuitry determines the change in battery voltage due to the current pulse I using amplifier 52 and analog-to-digital converter 54. The value of current I generated by current source 50 is known and is stored in memory 20. In one embodiment, current I is obtained by applying a load to battery 12. Microprocessor system 24 calculates the conductance of battery 12 using the following equation:

$$G_{BAT} = \frac{\Delta I}{\Delta V} \qquad \text{Equation 1}$$

where ΔI is the change in current flowing through battery 12 due to current source 50 and ΔV is the change in battery voltage due to applied current ΔI. Based upon the battery conductance $G_{BAT}$ and the battery voltage, the battery tester 10 determines the condition of battery 12. Battery tester 10 is programmed with information which can be used with the determined battery conductance and voltage as taught in the above listed patents to Dr. Champlin and Midtronics, Inc.

The tester can compare the measured CCA (Cold Cranking Amp) with the rated CCA for that particular battery. Additional information relating to the conditions of the battery test can be received by microprocessor system 24 from input device 68. Input device 68 may comprise one or more sensors, for example, or other elements which provide information such as ambient or battery temperature, time, date, humidity, barometric pressure, noise amplitude or characteristics of noise in the battery or in the test result, or any other information or data which may be sensed or otherwise recovered which relates to the conditions of the test how the battery test was performed, or intermediate results obtained in conducting the test.

As mentioned above, cable 14 includes a first Kelvin connection 26, which has a first conductor 26A and a second conductor 26B, and a second Kelvin connection 28, which has a first conductor 28A and second conductor 28B, and a plug 30 through which these conductors pass. However, more specifically, each Kelvin connector or connection (such as 26, 28) includes a first and second conductor, each of which is coupled to a connector of plug 30. Further, in some embodiments, cable 14 is a part of tester 10. Consequently, a specific embodiment of the present invention is directed to an electronic battery tester (such as 10) for testing a storage battery (such as 12) in which a first and second Kelvin connector (such as 26, 28) are configured to electrically couple to terminals of the battery (such as 12). Also included, is a plug (such as 30) having a first connector coupled to a first conductor of the first Kelvin connector, a second connector coupled to a second conductor of the first Kelvin connector, a third connector coupled to a first conductor of the second Kelvin connector, a fourth connector coupled to a second conductor of the second Kelvin connector, and a cable identification connector. A memory (such as 20) contains a first and a second calibration value. Test circuitry (such as 18), coupled to the first and second Kelvin connectors through the plug (such as 30), tests the storage battery as a function of the first calibration value if the cable identification connector has a first electrical value and as a function of the second calibration value if the cable identification connector has a second electrical value.

Figure 5:
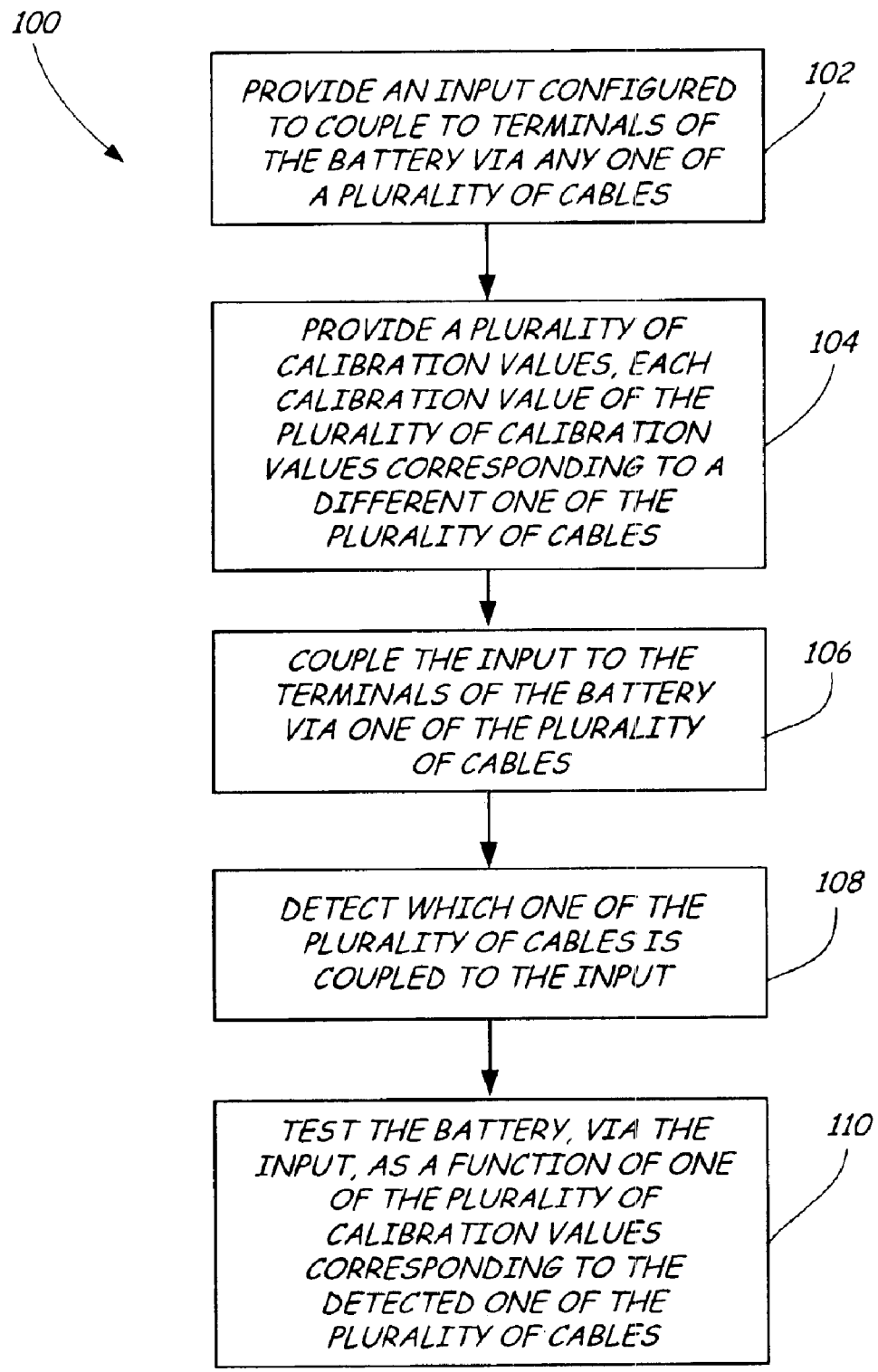
FIG. 5 is a flow chart of a system for detecting a type of cable through which a battery tester is connected to a battery in accordance an embodiment of the present invention.

FIG. 5 is a flow chart 100 of a system for detecting a type of cable through which a battery tester is connected to a battery in accordance with an embodiment of the present invention. At step 102, an input configured to couple to terminals of a battery via any one of a plurality of cables is provided. At step 104, a plurality of calibration values, each calibration value of the plurality values corresponding to a different one of the plurality of cables is provided. At step 106, the input is coupled to the terminals of the battery via one of plurality of cables. At step 108, one of the plurality of cables that is coupled to the input is detected. At step 110, the battery is tested via the input, as a function of one of the plurality of calibration values corresponding to the detected one of the plurality of cables. Different techniques, some of which are set forth above, can be employed to carry out the steps shown in the flow chart of FIG. 5 while maintaining substantially the same functionality without departing from the scope and spirit of the present invention.

Although the present invention has been described with reference to preferred embodiments, workers skilled in the art will recognize that changes may be made in form and detail without departing from the spirit and scope of the invention.

What is claimed is:

1. An electronic battery tester connectable to a battery through any one of a plurality cables, the tester comprising:
   an input configured to couple to any one of the plurality of cables;
   a memory configured to contain a plurality of calibration values, each calibration value of the plurality of calibration values corresponding to a different one of the plurality of cables; and
   test circuitry, coupled to the input and to the memory, configured to detect which one of the plurality of cables is coupled to the input, and to test the battery as a function of one of the plurality of calibration values corresponding to the detected one of the plurality of cables.

2. The electronic battery tester of clam 1 wherein the test circuitry is configured to detect which one of the plurality of cables is coupled to the input by determining an identification characteristic of one of the plurality of cables which is coupled to the input, and wherein the determined identification characteristic is one of a plurality of identification characteristics, each one of the plurality of identification characteristics corresponding to a different one of the plurality of cables.

3. The electronic battery tester of claim 2 wherein the memory is further configured to store the plurality of identification characteristics, and wherein each calibration value of the plurality of calibration values corresponding to a different one of the plurality of identification characteristics.

4. The electronic battery tester of claim 2 wherein the tester is configured to test the battery as the function of the one of the plurality of calibration values corresponding to the determined identification characteristic.

5. The electronic battery tester of claim 2 wherein each one of the plurality of identification characteristics having a different resistance value.

6. The electronic battery tester of claim 2 wherein each one of the plurality of identification characteristics having a different capacitance value.

7. The electronic battery tester of claim 2 wherein each one of the plurality of identification characteristics having a different inductance value.

8. The electronic battery tester of claim 2 wherein the input is further configured to couple to a cable identification conductor of a plurality of cable identification conductors, each cable identification conductor included in the different one of the plurality of cables, and each cable identification characteristic included in a different one of the plurality of cable identification conductors.

9. The electronic battery tester of claim 8 wherein the test circuitry is configured to determine the cable identification characteristic included in the cable identification conductor, of the plurality of cable identification conductors, coupled to the input form a response of the cable identification conductor to an applied cable detection voltage.

10. An cable for coupling an electronic battery tester to a storage battery, the cable comprising:
    a first Kelvin connector, including a first conductor and a second conductor, configured to couple a first battery terminal to the tester;

a second Kelvin connector, including a first conductor and a second conductor, configured to couple a second battery terminal to the tester; and a cable identification conductor including an identification characteristic for detection by the battery tester.

11. The cable of claim 10 wherein the identification characteristic having a resistance value that can be determined by the tester.

12. The cable of claim 10 wherein the cable identification characteristic having a capacitance value that can be determined by the tester.

13. The cable of claim 10 wherein the cable identification characteristic having an inductance value that can be determined by the tester.

14. The cable of claim 10 wherein the cable identification characteristic is stored in a memory, included in the cable, form which the cable identification characteristic can be provided to the tester.

15. A method of testing a battery, comprising:
   (a) providing an input configured to couple to terminals of the battery via any one of a plurality of cables;
   (b) providing a plurality of calibration values, each calibration value of the plurality of calibration values corresponding to a different one of the the plurality of cables, the plurality of calibration values being stored in a memory;
   (c) coupling the input to the terminals of the battery via one of the plurality of cables;
   (d) detecting which one of the plurality of cables is coupled to the input; and
   (e) testing the battery, via the input, as a function of one of the plurality of calibration values corresponding to the detected one of the plurality of cables.

16. The method of claim 15 wherein the detecting step (d) comprising determining a resistance value of the one of the plurality of cables coupled to the input.

17. The method of claim 15 wherein the detecting step (d) comprising determining a capacitance value of the one of the plurality of cables coupled to the input.

18. The method of claim 15 wherein the detecting step (d) comprising determining an inductance value of the one of the plurality of cables coupled to the input.

19. An electronic battery tester for testing a storage battery, comprising:
   a first Kelvin connector configured to electrically couple to a first terminal of the battery;
   a second Kelvin connector configured to electrically couple to a second terminal of the battery;
   a plug having:
      a first connector coupled to a first conductor of the first Kelvin connector,
      a second connector coupled to a second conductor of the first Kelvin connector,
      a third connector coupled to a first conductor of the second Kelvin connector,
      a fourth connector coupled to a second conductor of the second Kelvin connector; and
      a cable identification connector;
   a memory configured to contain a first and a second calibration value; and
   test circuitry coupled to the first and second Kelvin connectors through the plug configured to test the storage battery as a function of the first calibration value if the cable identification connector has a first electrical value and as a function of the second calibration value if the cable identification connector has a second electrical value.

* * * * *

UNITED STATES PATENT AND TRADEMARK OFFICE
CERTIFICATE OF CORRECTION

PATENT NO. : 6,891,378 B2
APPLICATION NO. : 10/396550
DATED : May 10, 2005
INVENTOR(S) : Kevin I. Bertness et al.

Page 1 of 1

It is certified that error appears in the above-identified patent and that said Letters Patent is hereby corrected as shown below:

Title Page
Page 3, Item [56] References Cited Foreign Patent Documents add --WO 93/22666 11/1993--

Page 4, Item [56] References Cited Other Publications, Col. 2, second reference, delete "Japanes" and insert --Japanese--

Page 4, Item [56] References Cited under Other Publications, Col. 2, ninth reference, delete "#:" and add --#12:--

Signed and Sealed this

Eighth Day of December, 2009

David J. Kappos
*Director of the United States Patent and Trademark Office*

UNITED STATES PATENT AND TRADEMARK OFFICE
CERTIFICATE OF CORRECTION

PATENT NO. : 6,891,378 B2  Page 1 of 1
APPLICATION NO. : 10/396550
DATED : May 10, 2005
INVENTOR(S) : Kevin I. Bertness et al.

It is certified that error appears in the above-identified patent and that said Letters Patent is hereby corrected as shown below:

Title Page

Page 3, Item [56] References Cited Foreign Patent Documents add --WO 98/58270 12/1998--

Signed and Sealed this

Fifth Day of January, 2010

David J. Kappos
*Director of the United States Patent and Trademark Office*